United States Patent
Culp et al.

(10) Patent No.: US 8,232,215 B2
(45) Date of Patent: Jul. 31, 2012

(54) SPACER LINEWIDTH CONTROL

(75) Inventors: James A. Culp, Newburgh, NY (US); Jeffrey P. Gambino, Westford, VT (US); John J. Ellis-Monaghan, Grand Isle, VT (US); Kirk D. Peterson, Jericho, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 12/622,557

(22) Filed: Nov. 20, 2009

(65) Prior Publication Data

US 2010/0261351 A1 Oct. 14, 2010

Related U.S. Application Data

(60) Provisional application No. 61/167,558, filed on Apr. 8, 2009.

(51) Int. Cl.
*H01L 21/302* (2006.01)

(52) U.S. Cl. ........ 438/734; 438/725; 438/735; 438/736; 216/72

(58) Field of Classification Search .................. 438/706, 438/710, 714, 723, 725, 734, 736, 594, 595, 438/737; 216/72, 81
See application file for complete search history.

(56) References Cited

U.S. PATENT DOCUMENTS

| | | | |
|---|---|---|---|
| 6,090,717 A | 7/2000 | Powell et al. | |
| 6,103,611 A | 8/2000 | En et al. | |
| 6,277,543 B1 * | 8/2001 | Furukawa et al. | 430/311 |
| 6,380,588 B1 | 4/2002 | En et al. | |
| 6,495,425 B1 * | 12/2002 | Chiang | 438/305 |
| 6,846,618 B2 | 1/2005 | Hsu et al. | |
| 6,995,074 B2 | 2/2006 | Kim | |
| 7,319,074 B2 | 1/2008 | Chou et al. | |
| 2003/0124776 A1 * | 7/2003 | Chung et al. | 438/128 |
| 2004/0137373 A1 * | 7/2004 | Lei et al. | 430/313 |
| 2007/0249170 A1 | 10/2007 | Kewley | |
| 2007/0275309 A1 * | 11/2007 | Liu | 430/5 |

OTHER PUBLICATIONS

Fischer, et al., "Spray Coating—a Solution for Resist Film Deposition Across Severe Topography", 2004 IEEE/SEMI Int'l Electronics Manufacturing Technology Symposium.

* cited by examiner

*Primary Examiner* — Lan Vinh
(74) *Attorney, Agent, or Firm* — Scully, Scott, Murphy & Presser, P.C.; Richard M. Kotulak, Esq.

(57) ABSTRACT

A method for forming a plurality of variable linewidth spacers adjoining a plurality of uniformly spaced topographic features uses a conformal resist layer upon a spacer material layer located over the plurality of uniformly spaced topographic features. The conformal resist layer is differentially exposed and developed to provide a differential thickness resist layer that is used as a sacrificial mask when forming the variable linewidth spacers. A method for forming uniform linewidth spacers adjoining narrowly spaced topographic features and widely spaced topographic features over the same substrate uses a masked isotropic etching of a variable thickness spacer material layer to provide a more uniform partially etched spacer material layer, followed by an unmasked anisotropic etching of the partially etched spacer material layer. A related method for forming the uniform linewidth spacers uses a two-step anisotropic etch method that includes at least one masking process step.

18 Claims, 10 Drawing Sheets

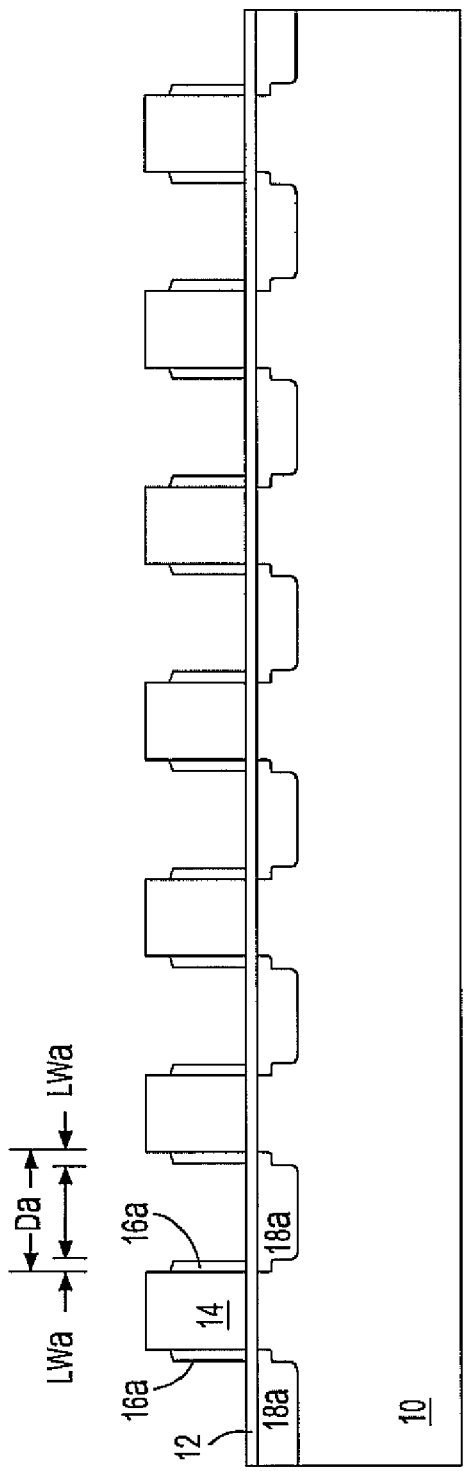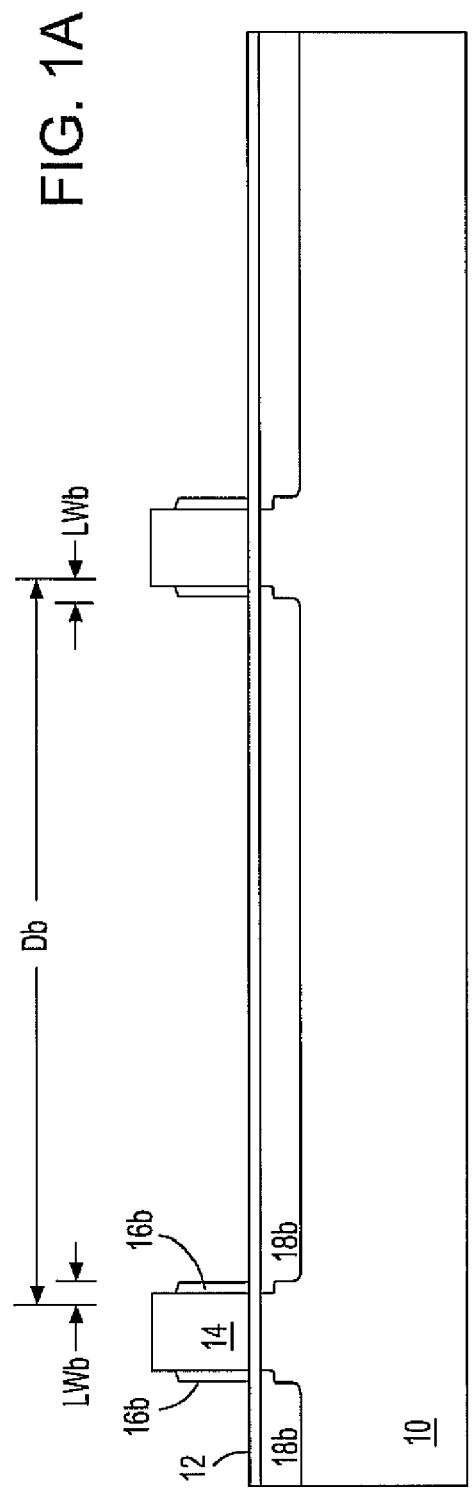

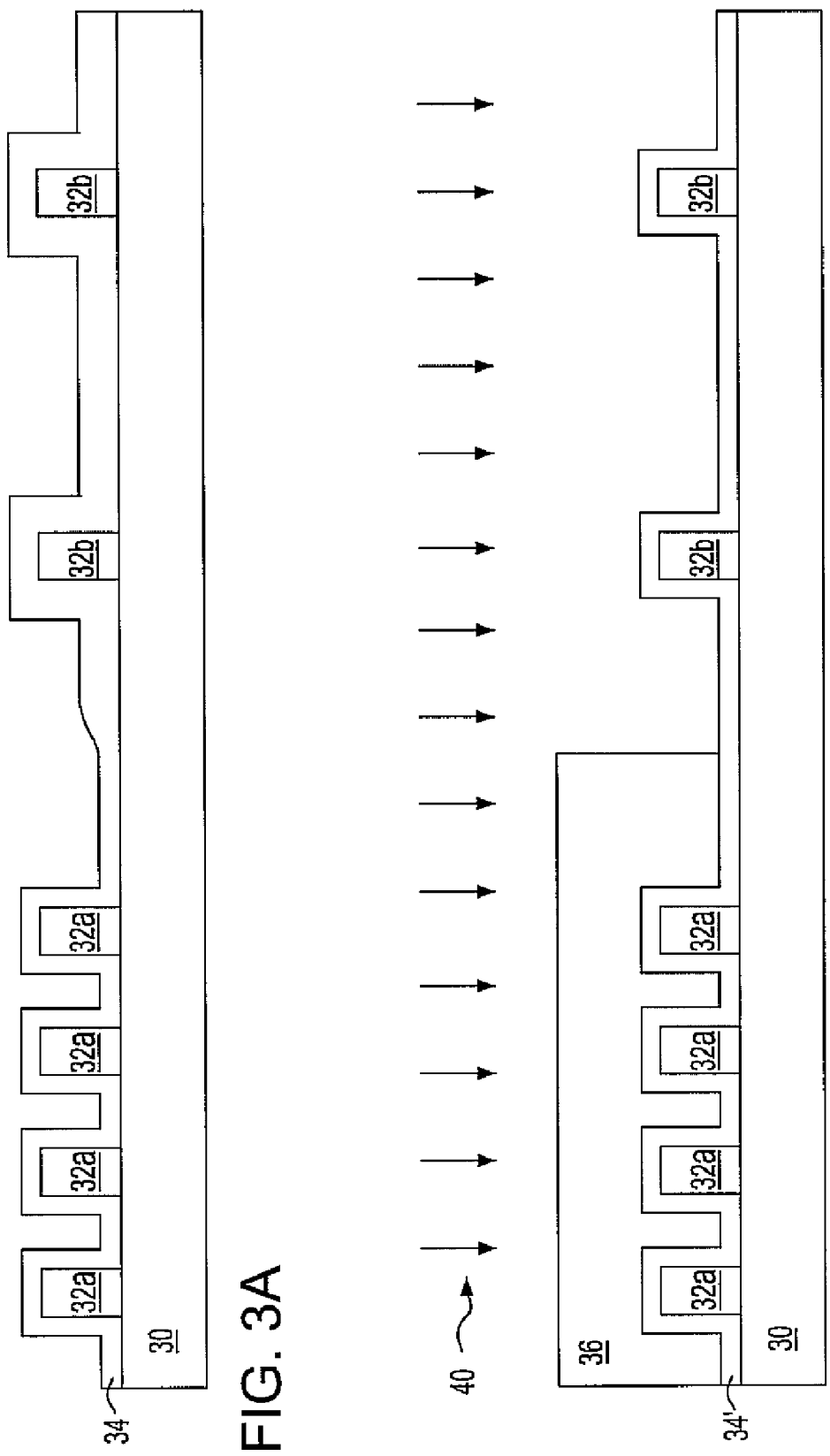

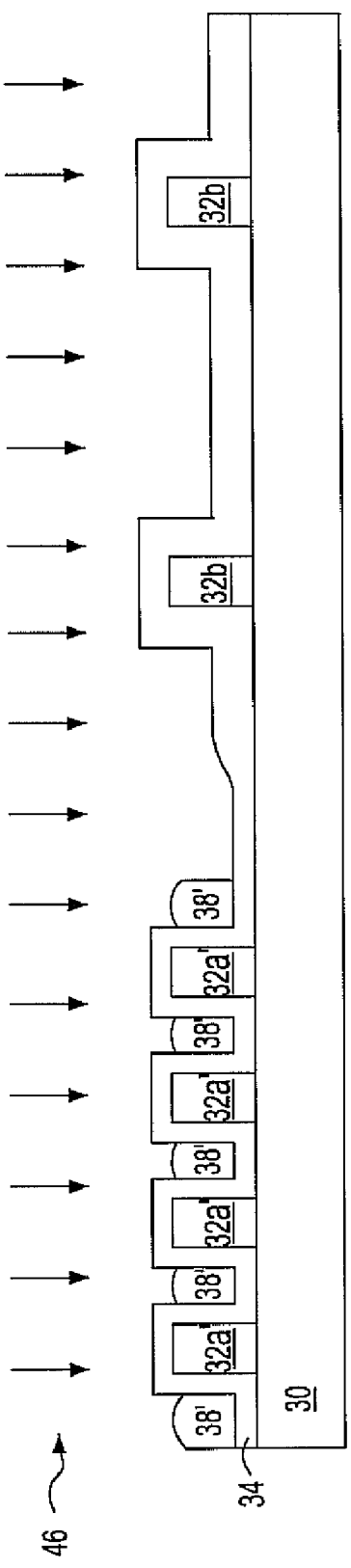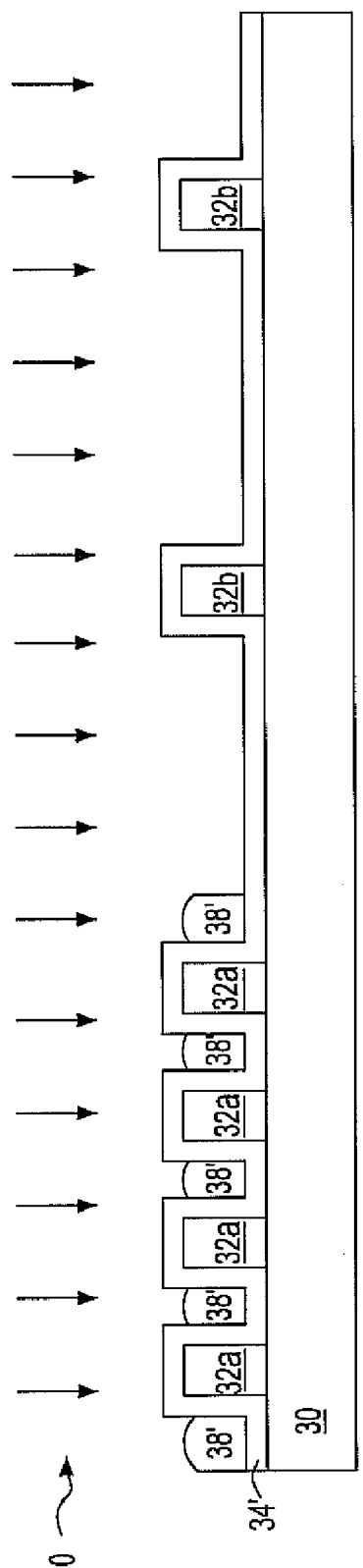

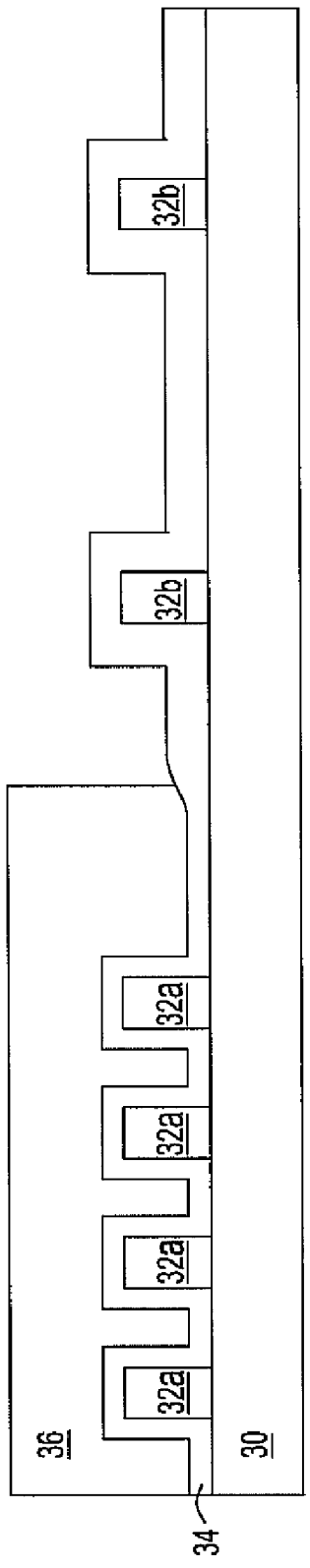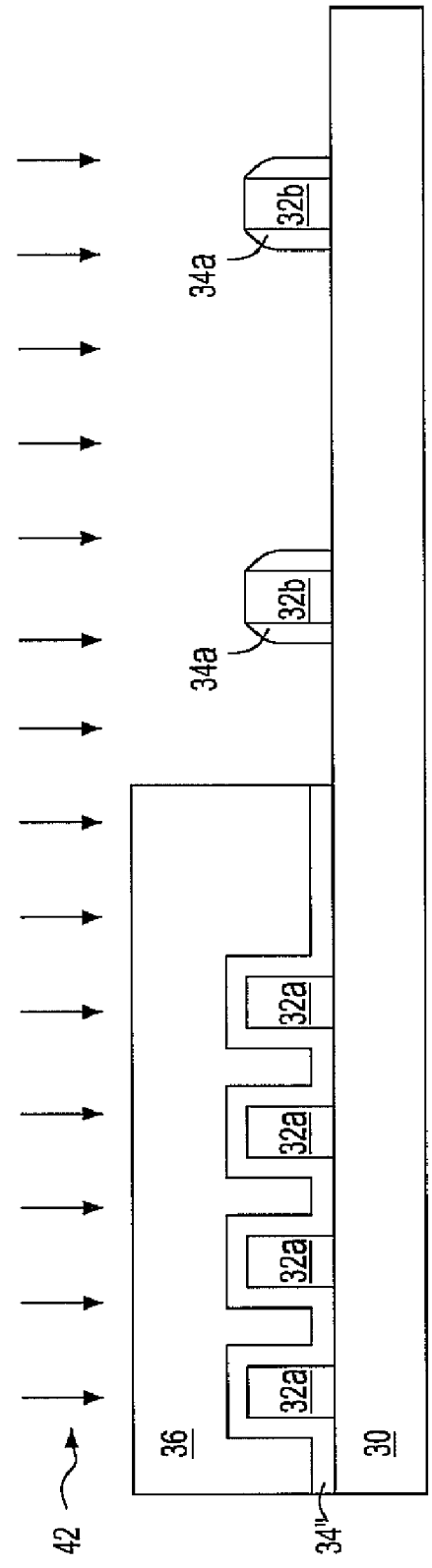

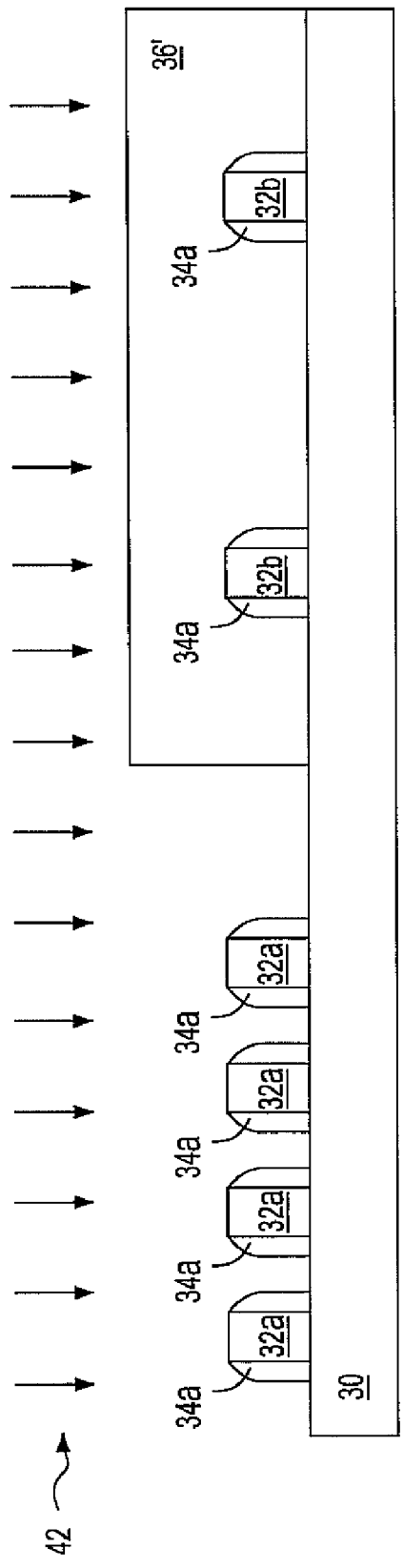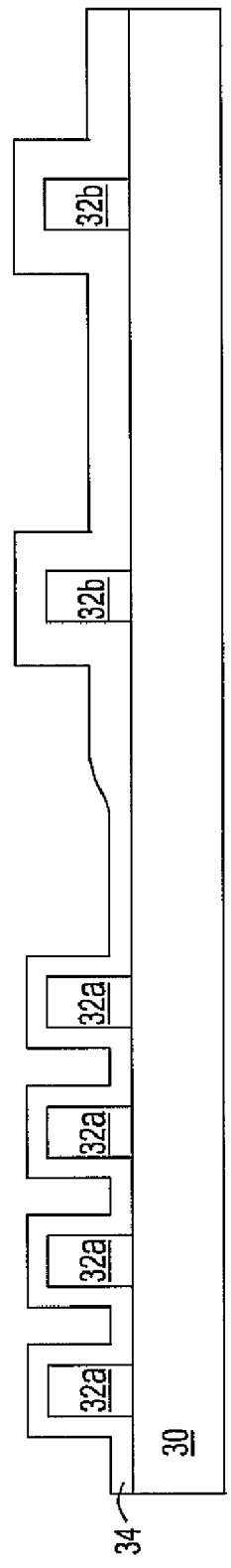
FIG. 5C
FIG. 6A

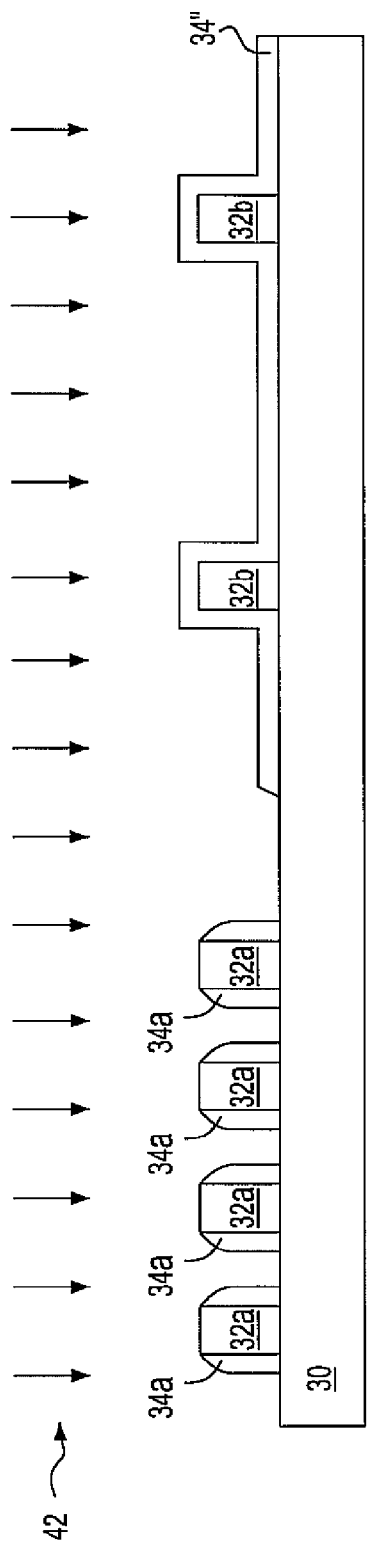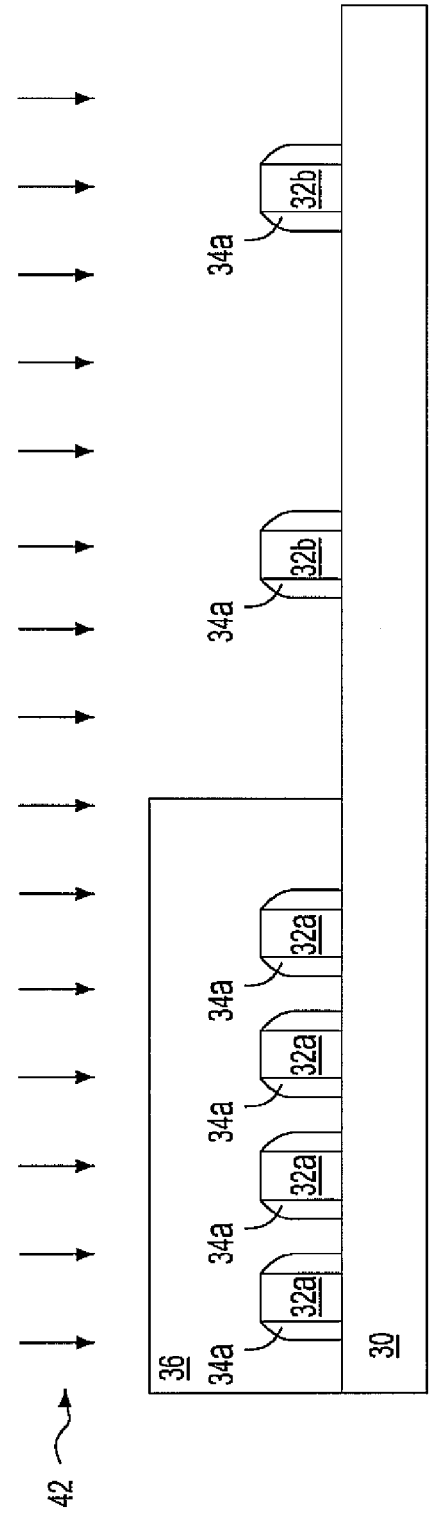

SPACER LINEWIDTH CONTROL

BACKGROUND

1. Field of the Invention

The invention relates generally to spacers within microelectronic structures. More particularly, the invention relates to methods for controlling spacer linewidth within microelectronic structures.

2. Description of the Related Art

Semiconductor structures typically include semiconductor substrates within and upon which are located and formed semiconductor devices, such as but not limited to resistors, transistors, diodes and capacitors. The semiconductor devices are connected and interconnected using patterned conductor layers that are separated by dielectric layers.

A particular sub-structure that may be used within a semiconductor structure as an adjunct to any or all of the foregoing semiconductor devices is a spacer. A spacer typically comprises three sides in cross-section, where two of the three sides are perpendicular and the remaining side of the three sides outwardly curves and connects the other two sides that are perpendicular. Spacers are often located and formed adjoining nominally perpendicular sidewalls of semiconductor device features. Such a spacer may often be used, for example, for purposes of separating and isolating a contact region portion of a semiconductor device from other portions of the semiconductor device. Spacers are generally formed using blanket spacer material layer deposition and anisotropic etchback method that provides the spacer of the foregoing three-sided shape. Although not specifically so limited, spacers also generally comprise dielectric materials.

Spacers are a desirable feature within semiconductor structures, due to their ability to effectively horizontally isolate components within semiconductor structures. However, in order to effectively serve such a function, spacers are often desirably or necessarily fabricated with a uniform linewidth.

To that end, desirable are linewidth controlled spacers and methods for fabricating linewidth controlled spacers.

SUMMARY

The invention provides a plurality of methods for fabricating, adjoining a plurality of topographic features within a microelectronic structure, and more particularly a semiconductor structure, a plurality of spacers that has a controlled linewidth.

One particular method for fabricating the plurality of spacers with a controlled linewidth provides variable linewidth spacers for a plurality of evenly spaced topographic features. This particular method uses a variable thickness conformal resist layer located and formed upon a spacer material layer in turn located and formed upon the plurality of evenly spaced topographic features.

Other particular methods for fabricating spacers with controlled linewidth provide uniform linewidth spacers for unevenly spaced topographic features. These particular methods use multiple etch process steps in conjunction with masking process steps, when providing the uniform linewidth spacers for the unevenly spaced topographic features.

A particular method in accordance with the invention includes forming upon a substrate that includes a plurality of evenly spaced topographic features a conformal spacer material layer. This particular method also includes forming upon the conformal spacer material layer a conformal resist layer. This particular method also includes differentially exposing and developing the conformal resist layer over different topographic features to leave remaining a differential thickness resist residue layer upon the conformal spacer material layer over the different topographic features. This particular method also includes sequentially etching the differential thickness resist residue layer and the conformal spacer material layer to provide different thickness spacers adjoining the different topographic features.

Another particular method in accordance with the invention includes masking a lesser thickness portion of a spacer material layer over a plurality of narrowly spaced topographic features within a structure that includes: (1) the plurality of narrowly spaced topographic features and a plurality of widely spaced topographic features formed over a substrate; and (2) the spacer material layer formed over the substrate, the closely spaced topographic features and the widely spaced topographic features, the spacer material layer having the lesser thickness portion over the narrowly spaced topographic features and a greater thickness portion over the widely spaced topographic features. This other method also includes isotropically etching the greater thickness portion of the spacer material layer to provide a partially etched spacer material layer. This other method also includes unmasking the lesser thickness portion of the partially etched spacer material layer. This other method also includes anisotropically etching the partially etched spacer material layer to provide a plurality of uniform linewidth spacers adjoining the narrowly spaced topographic features and the widely spaced topographic features.

Yet another particular method in accordance with the invention includes anisotropically etching, while using a two-step anisotropic etch method that includes at least one masking step, a spacer material layer within a structure that includes: (1) a plurality of narrowly spaced topographic features and a plurality of widely spaced topographic features formed over a substrate; and (2) the spacer material layer formed over the substrate, the narrowly spaced topographic features and the widely spaced topographic features, the spacer material layer having the lesser thickness portion over the narrowly spaced topographic features and a greater thickness portion over the widely spaced topographic features. The anisotropically etching providing a plurality of uniform linewidth spacers adjoining the plurality of narrowly spaced topographic features and the plurality of widely spaced topographic features.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein:

FIG. 1A and FIG. 1B illustrate a spacer linewidth effect as a function of uniform topographic feature aerial density (more dense in FIG. 1A and less dense in FIG. 1B) that forms the basis for embodiments of the invention.

FIG. 3A to FIG. 3C show a series of schematic cross-sectional diagrams illustrating the results of progressive microelectronic structure fabrication (FIG. 3A), isotropic etch (FIG. 3B) and anisotropic etch (FIG. 3C) process steps in providing uniform linewidth spacers adjoining variably spaced topographic features in accordance with another particular embodiment of the invention.

FIG. 4A to FIG. 4E show a series of schematic cross-sectional diagrams illustrating the results of progressive microelectronic structure fabrication (FIG. 4A), etchback (FIG. 4B), isotropic etch (FIG. 4C), stripping (FIG. 4D) and anisotropic etch (FIG. 4E) process steps in fabricating uniform linewidth spacers adjoining variably spaced topographic features in accordance with another particular embodiment of the invention.

FIG. 5A to FIG. 5C show a series of schematic cross-sectional diagrams illustrating the results of progressive microelectronic structure fabrication (FIG. 5A), anisotropic etch (FIG. 5B) and anisotropic etch (FIG. 5C) process steps in fabricating uniform linewidth spacers adjoining variably spaced topographic features in accordance with another particular embodiment of the invention.

FIG. 6A to FIG. 6C show a series of schematic cross-sectional diagrams illustrating the results of progressive microelectronic structure fabrication (FIG. 6A), anisotropic etch (FIG. 6B) and anisotropic etch (FIG. 6C) process steps in fabricating uniform linewidth spacers adjoining variably spaced topographic features in accordance with another particular embodiment of the invention.

DESCRIPTION OF THE PREFERRED EMBODIMENT

Figure 2A:
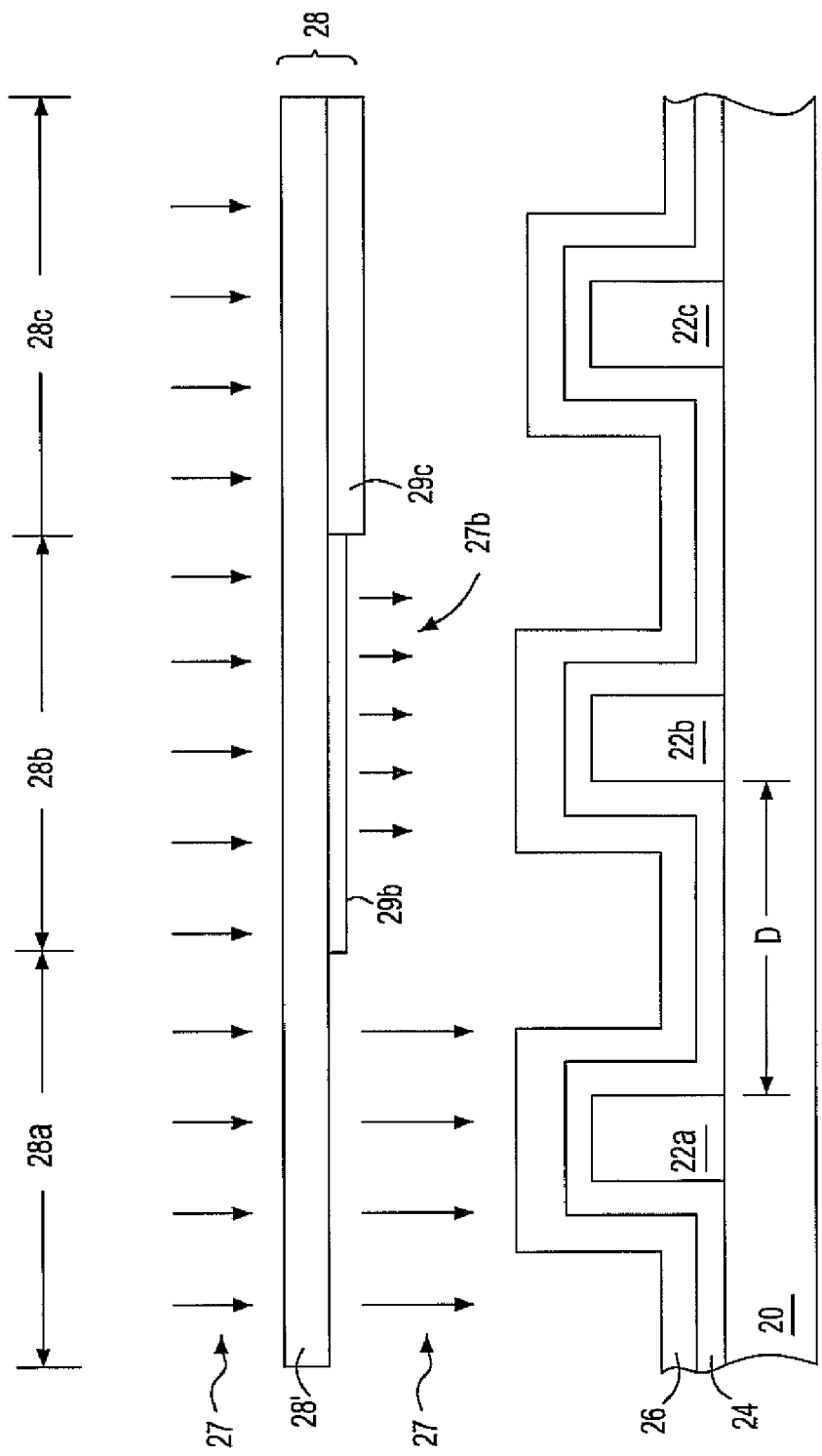
FIG. 2A to FIG. 2C show a series of schematic cross-sectional diagrams illustrating successive resist photoexposure (FIG. 2A), resist development (FIG. 2B) and spacer material layer etch (FIG. 2C) process steps in accordance with a particular embodiment of the invention that provides variable controlled linewidth spacers adjoining sidewalls of uniformly spaced topographic features.

The invention, which provides a plurality of methods for forming controlled linewidth spacers adjoining topographic features within a microelectronic structure, such as a semiconductor structure, is understood within the context of the Description of the Preferred Embodiments, as set forth below. The Description of the Preferred Embodiments is understood within the context of the drawings described above. Since the drawings are intended for illustrative purposes, the drawings are not necessarily drawn to scale.

FIG. 1A and FIG. 1B show a plurality of schematic cross-sectional diagrams illustrating a spacer linewidth effect as a function of topographic feature spacing that provides a basis for embodiments of the invention.

FIG. 1A and FIG. 1B show a semiconductor substrate 10. A gate dielectric 12 is located and formed upon the substrate semiconductor substrate 10. Gates 14 are located and formed upon the gate dielectric 12 with a narrower spacing Da (i.e., less than 100 nanometers to 400 nanometers) in FIG. 1A than a wider spacing Db (i.e., less than 200 nanometers to 500 nanometers) in FIG. 1B. Located and formed adjoining the gates 14 in FIG. 1A are spacers 16a. Located and formed adjoining the gates 14 in FIG. 1B are spacers 16b Located and formed within the semiconductor substrate 10 within FIG. 1A and separated by the gates 14 are source and drain regions 18a. Located and formed within the semiconductor substrate 10 within FIG. 1B and separated by the gates 14 are source and drain regions 18b.

Each of the foregoing semiconductor substrates 10 and overlying layers and structures 12/14/16a-b/18a-b within the schematic cross-sectional diagrams of FIG. 1A and FIG. 1B may comprise materials, have dimensions and be formed using methods that are otherwise generally conventional in the semiconductor fabrication art.

For example, the semiconductor substrate 10 may comprise a semiconductor material as is otherwise generally conventional in the semiconductor fabrication art. Suitable semiconductor materials may include, but are not necessarily limited to silicon, germanium, silicon-germanium alloy, silicon-germanium-carbon alloy and compound semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material.

Although the semiconductor structures whose schematic cross-sectional diagrams are illustrated in FIG. 1A and FIG. 1B illustrate a nominally bulk semiconductor substrate 10, particular embodiments that follow are not intended to be so limited. Rather, the embodiments and the invention also contemplate in place of a bulk semiconductor substrate for the semiconductor substrate 10: (1) a semiconductor-on-insulator substrate (i.e., having a dielectric layer located and formed within a depth of a semiconductor substrate); and (2) a hybrid orientation substrate (i.e., that include multiple semiconductor crystallographic regions supported by a single substrate).

Semiconductor-on-insulator substrates and hybrid orientation substrates may be formed using layer transfer methods, layer lamination methods and separation by implantation of oxygen (SIMOX) methods.

The gate dielectric 12 may comprise conventional dielectric materials such as oxides, nitrides and oxynitrides of silicon that have a dielectric constant from 4 to 20, measured in vacuum. Alternatively, the gate dielectric 12 may comprise generally higher dielectric constant dielectric materials having a dielectric constant from 20 to at least 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectric 12 may be formed using any of several methods that are appropriate to its material(s) of composition. Included but not limiting are thermal or plasma oxidation or nitridation methods, chemical vapor deposition methods and physical vapor deposition methods. Typically, the gate dielectric 12 comprises a thermal silicon oxide dielectric material that has a thickness from 1 to 50 nanometers.

The gates 14 may comprise materials including, but not limited to certain metals, metal alloys, metal nitrides and metal silicides, as well as laminates thereof and composites thereof. The gates 14 may also comprise doped polysilicon and doped polysilicon-germanium alloy materials (i.e., having a dopant concentration from 1e18 to 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gates 14 comprise a doped polysilicon material that has a thickness from 50 to 500 nanometers.

The spacers 16a and 16b may comprise materials including but not limited to conductor materials and dielectric materials. Conductor spacer materials are less common, but are nonetheless known. Dielectric spacer materials are more common. The spacer materials may be formed using methods that are appropriate for the conductor materials or dielectric materials from which they are comprised. As described above, the spacers 16a and 16b are also formed with the distinctive inward pointing spacer shape by using a blanket layer deposition and anisotropic etchback method. Typically, the spacers 16a and 16b comprise a silicon oxide dielectric material or a silicon nitride dielectric material.

The source and drain regions 18a and 18b comprise a generally conventional dopant as is appropriate to a field effect transistor desired to be fabricated within the semiconductor structure of FIG. 1A or FIG. 1B. As is understood by a person skilled in the art, the source and drain regions 18a and 18b are formed using a two-step ion implantation method. A first ion implantation process step within the method uses a gate 14, absent a spacer 16a or 16b that encircles the particular gate 14 as a mask, to form a plurality of extension regions each of which extends beneath the particular spacer 16a or 16b. A second ion implantation process step uses the gate 14 and the particular spacer 16a or 16b as a mask to form the larger contact region portions of the plurality of source and drain regions 18a and 18b, while simultaneously incorporating the extension regions. Dopant levels are from 1e19 to 1e21 dopant atoms per cubic centimeter within each of the source and drain regions 18a and 18b. Extension regions within the source and drain regions 18a and 18b may under certain circumstances be more lightly doped than contact regions with the source and drain regions 18a and 18b, although such differential doping concentrations are not a requirement of the embodiment or of the invention.

As is illustrated within the schematic cross-sectional diagrams of FIG. 1A and FIG. 1B, the spacers 16a in FIG. 1A have a narrower linewidth LWa (i.e., from 10% to 30% narrower) in comparison with a wider linewidth Lb for the spacers 16b in FIG. 1B. Such a narrower linewidth LWa for the spacer 16a and wider linewidth LWb for the spacer 16b is understood as deriving from the spacing of the gates 14 within FIG. 1A in comparison with the gates 14 within FIG. 1B. Such differential spacer 16a and 16b linewidth is undesirable insofar as such a differential spacer 16a or 16b linewidth provides a differential extension region widths that in turn provide different operating characteristics of the transistors within the schematic cross-sectional diagram of FIG. 1A in comparison with the transistors within the schematic cross-sectional diagram of FIG. 1B.

Later embodiments of the invention seek to provide uniform linewidth spacers independent of gate 14 spacing, or other topographic feature spacing. The invention also contemplates a particular embodiment that provides for variable linewidth spacers adjoining uniformly separated topographic features over a single substrate. This particular embodiment is illustrated within the schematic cross-sectional diagrams of FIG. 2A to FIG. 2C.

In addition, while FIG. 1A and FIG. 1B illustrate the spacers 16a and 16b within the context of field effect transistor devices, the embodiments and the invention are not intended to be so limited. Rather the embodiments and the invention may be practiced within the context of spacers that comprise conductor materials, semiconductor materials or dielectric materials located adjacent or adjoining topographic features that comprise conductor materials, semiconductor material or dielectric materials, further located over substrates that comprise conductor materials, semiconductor materials or dielectric materials. To that end, the following embodiments are described within the context of substrates in general, topographic features in general and controlled linewidth spacers, absent further description of a further application of the spacers.

FIG. 2A illustrates a substrate 20. Uniform topographic features 22a, 22b and 22c are located nominally uniformly spaced (i.e., having a separation distance D as illustrated in FIG. 1A or FIG. 1B from 100 to 500 nanometers) over the substrate 20. Located and formed covering the substrate 20 and the topographic features 22a, 22b and 22c is a spacer material layer 24. Located and formed upon the spacer material layer 24 is a conformal resist layer 26.

Within this particular embodiment, the conformal resist layer 26 may comprise either a positive resist material or a negative resist material. The conformal resist layer 26 typically comprises a highly absorbing resist material that has an extinction coefficient from 0.01 to 0.05. The conformal resist layer 26 is typically formed conformally using a spray deposition method, such as but not limited to a plasma spray deposition method, that allows for a conformal resist layer to be deposited upon a substrate having a severe topography. See, e.g., Fischer et al., "Spray Coating—a Solution for Resist Film Deposition Across Severe Topography," 2004 IEEE SEMI Int'l Electronics Manufacturing Technology Symposium, 0-7803-8582-9/04.

FIG. 2A also shows a mask 28 located registered with respect to the substrate 20. The mask 28 comprises a transparent substrate 28', and the mask 28 is intended as a gray tone mask that has a transparent region 28a registered with respect to topographic feature 22a, an intermediate transmissive region 28b (i.e., including a partially transmissive material layer 29b) registered with respect to the topographic feature 22b and an opaque region 28c (i.e., including an opaque material layer 29c) registered with respect to the topographic feature 22c. Alternatively, a multiplicity of binary masks may also be used. Thus, incident to irradiation with actinic radiation 27, the conformal resist layer 26 located over the topographic feature 22a is completely irradiated with the actinic radiation 27, the conformal resist layer 26 located over the topographic feature 22b is intermediately irradiated with intermediate dose actinic radiation 27b and the conformal resist layer 26 located over the topographic feature 22c is not irradiated.

Figure 2B:
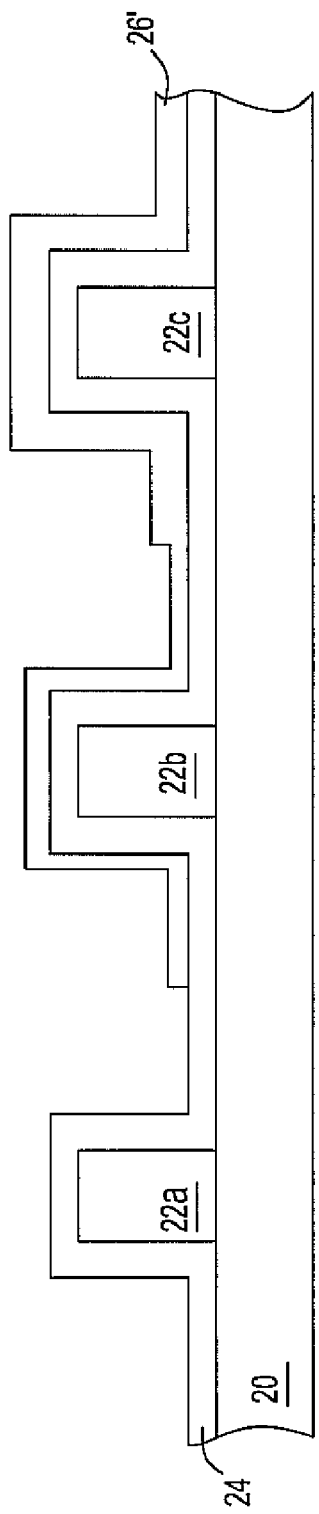

FIG. 2B shows the results of developing the conformal resist layer 26 that is illustrated within the schematic cross-sectional diagram of FIG. 2A after irradiation with the actinic radiation 27 to provide the conformal resist layer 26' absent any coverage over the topographic feature 22a, with a lower thickness (by 10% to 50% lower) over the topographic feature 22b compared to a full thickness over the topographic feature 22c.

Figure 2C:
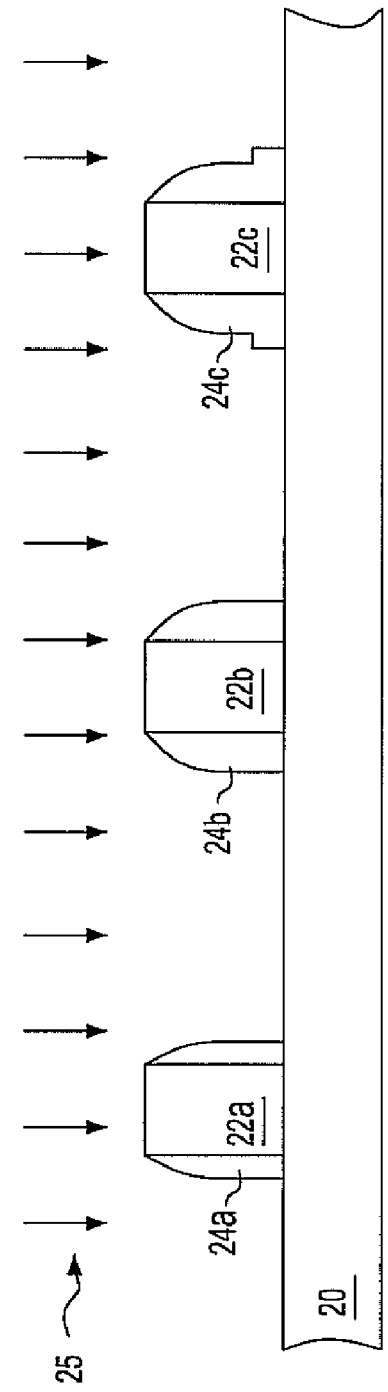

FIG. 2C shows the results of etching the microelectronic structure of FIG. 2B within an anisotropic etchant 25 (i.e., typically a plasma etch method) that has a similar if not identical selectivity for the conformal resist layer 26' and the spacer material layer 24, to provide progressively wider variable linewidth spacers 24a, 24b, and 24c adjoining corresponding topographic features 22a, 22b and 22c.

Thus, the particular embodiment that is illustrated within the context of the schematic cross-sectional diagrams of FIG. 2A to FIG. 2C provides a method for forming variable linewidth spacers 24a, 24b and 24c adjoining sidewalls of uniformly separated topographic features 22a, 22b and 22c located over a single substrate 20.

Remaining embodiments are intended as directed towards various methods for forming uniform linewidth spacers adjoining variably spaced topographic features upon a single substrate, and to that end are more closely directed towards the semiconductor structures of FIG. 1A and FIG. 1B.

Figure 3C:
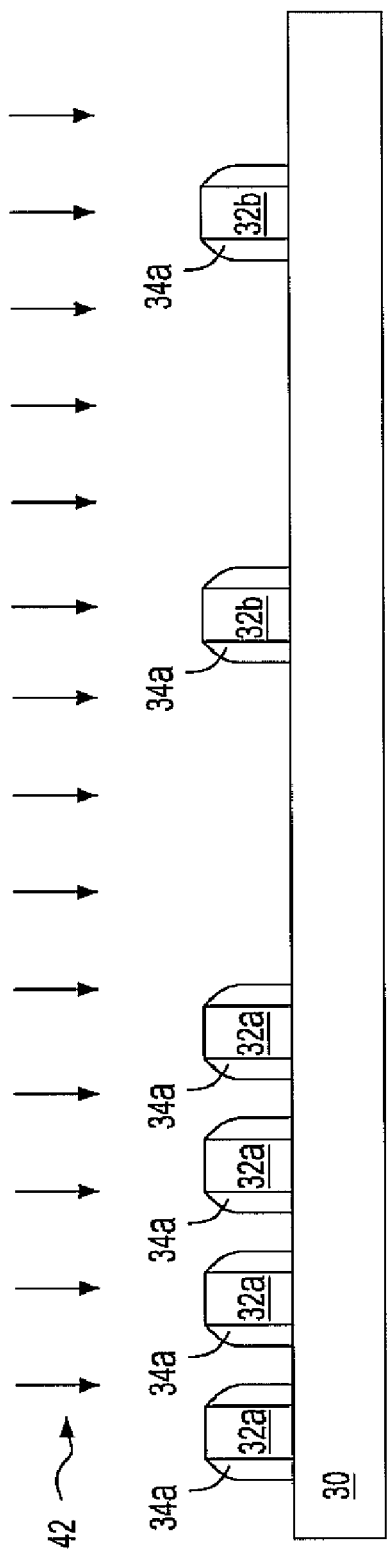

In that regard, FIG. 3A to FIG. 3C show the results of progressive process steps in fabricating a microelectronic structure in accordance with a particular embodiment of the invention that comprises a second embodiment of the invention.

FIG. 3A shows a substrate 30. Located and formed upon the substrate 30 is a plurality of narrowly spaced topographic features 32a (i.e., typically having a separation distance from <200 to 400 nanometers) and a plurality of widely spaced topographic features 32b (i.e., typically having a separation distance from >200 to 500 nanometers). Located and formed covering the substrate 30 and the topographic features 32a and 32b is a spacer material layer 34. As is illustrated within the schematic cross-sectional diagram of FIG. 3A, the spacer material layer 34 has a lesser thickness (i.e., by 10 to 50% less) over the narrowly spaced topographic features 32a compared to the widely spaced topographic features 32b. This differential in spacer material layer thickness may occur under circumstances where source material diffusion is inhibited when forming the spacer material layer 34 over the narrowly spaced topographic features 32a, within the context of a chemical vapor deposition method for forming the spacer material layer 34. Other rationale for the differences in thickness of the spacer material layer 34 over the narrowly spaced topographic features 32a and the widely spaced topographic features 32b are not precluded within the embodiments, nor within the invention.

FIG. 3B shows the results of masking the spacer material layer 34 that is illustrated within the schematic cross-sectional diagram of FIG. 3A, with a mask 36 located over the narrowly spaced topographic features 32a, but not the widely spaced topographic features 32b. The mask 36 may comprise any of several mask materials, including but not limited to hard mask material and photoresist mask materials. Photoresist mask materials are more common, but by no means limit the invention. Photoresist mask materials may include, but are not necessarily limited to, positive photoresist materials, negative photoresist materials and hybrid photoresist materials that possess the properties of positive photoresist materials and negative photoresist materials. Typically and preferably, the mask 36 comprises a positive photoresist material or a negative photoresist material that has a thickness from 100 to 1000 nanometers.

FIG. 3B next shows the results of etching the spacer material layer 34 to provide a partially etched spacer material layer 34' while using the mask 36 as an etch mask, in conjunction with an etchant 40 that typically comprises an isotropic etchant. As a result of this isotropic etching, the variable thickness spacer material layer 34 is etched to provide a more uniform partially etched spacer material layer 34'. The etchant 40 that typically comprises the isotropic etchant may comprise a wet chemical isotropic etchant or a dry plasma isotropic etchant. Dry plasma isotropic etchants, that may operate at a generally higher pressure in a range from 100 to 600 mtorr may under certain circumstances be preferred.

FIG. 3C first shows the results of stripping the mask 36 from the partially etched spacer material layer 34' that is illustrated within the schematic cross-sectional diagram of FIG. 3B. The mask 36 may be stripped using methods and materials that are otherwise generally conventional in the microelectronic fabrication art. Included in particular, but also not limiting, are wet chemical stripping methods and dry plasma stripping methods.

FIG. 3C next shows the results of etching the partially etched spacer material layer 34' to provide spacers 34a of a uniform linewidth (i.e., typically from 10 to 50 nanometers) that are intended as adjoining both the narrowly spacer topographic features 32a and the widely spaced topographic features 32b. Thus, this second embodiment provides a microelectronic structure that includes narrowly spaced topographic features 32a and widely spaced topographic features 32b located over a substrate 30, where both the narrowly spaced topographic features 32a and the widely spaced topographic features 32b have located and formed adjoining thereto spacers 34a that have a uniform linewidth.

FIG. 4A to FIG. 4E show a series of schematic cross-sectional diagrams illustrating the results of progressive process steps of fabricating a microelectronic structure in accordance with another embodiment of the invention. This other embodiment of the invention comprises a third embodiment of the invention.

Figure 4A:
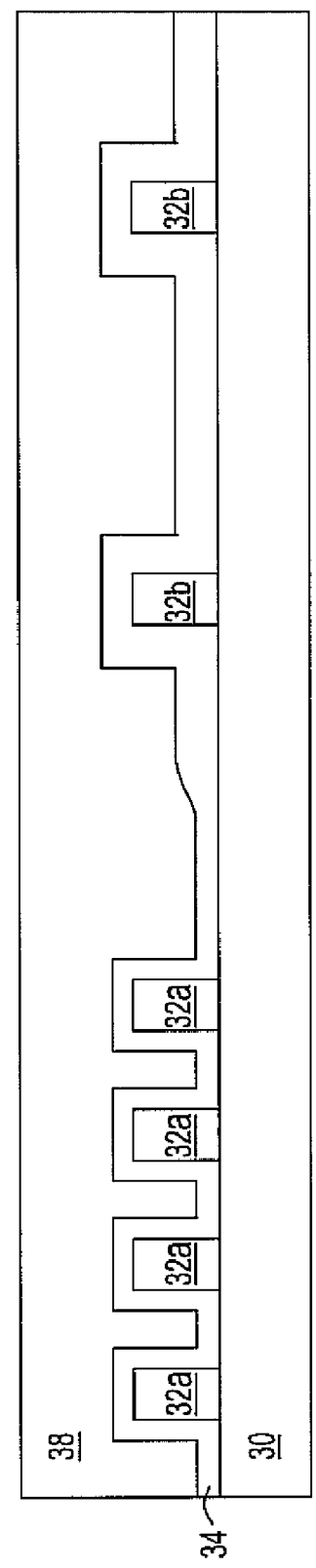

FIG. 4A shows a schematic cross-sectional diagram of the microelectronic structure at an early stage in the fabrication thereof in accordance with this third embodiment.

FIG. 4A shows a schematic cross-sectional diagram of a microelectronic structure that in a first instance corresponds with the microelectronic structure whose schematic cross-sectional diagram is illustrated in FIG. 3A, and includes the substrate 30, the narrowly spaced topographic features 32a and the widely spaced topographic features 32b, as well as the variable thickness spacer material layer 34 located and formed to a lesser thickness over the narrowly spaced topographic features 32a in comparison with the widely spaced topographic features 32b.

In addition, the microelectronic structure whose schematic cross-sectional diagram is illustrated in FIG. 4A newly includes a planarizing layer 38. The planarizing layer 38 may comprise any of several planarizing materials, including but not limited to spin-on planarizing materials (such as but not limited to spin-on-glass planarizing materials, spin-on-polymer planarizing materials, chemical vapor deposited planarizing materials or alternative planarizing materials). In addition, chemical vapor deposited planarizing materials that may be deposited as non-planarizing materials and subsequently planarized may also be used. Typically, the planarizing layer 38 comprises a spin-on planarizing material that has a thickness from 100 to 1000 nanometers.

FIG. 4B shows the results of etching back the planarizing layer 38 to form planarizing layer residues 38' located and formed interposed between the narrowly spaced topographic features 32a, but not the widely spaced topographic features 32b. Such an etching back of the planarizing layer 38 to provide the planarizing layer residues 38' uses an isotropic etchant 46 that is intended as providing a selective etching of the planarizing layer 38 that is illustrated within FIG. 4A with respect to the variable thickness spacer material layer 34.

FIG. 4C shows the results of etching the spacer material layer 36 selective to the planarizing material layer residues 38' while using the same isotropic etchant 40 that is illustrated in FIG. 3B, to form the partially etched spacer material layer 34' that has a more uniform thickness.

Figure 4D:
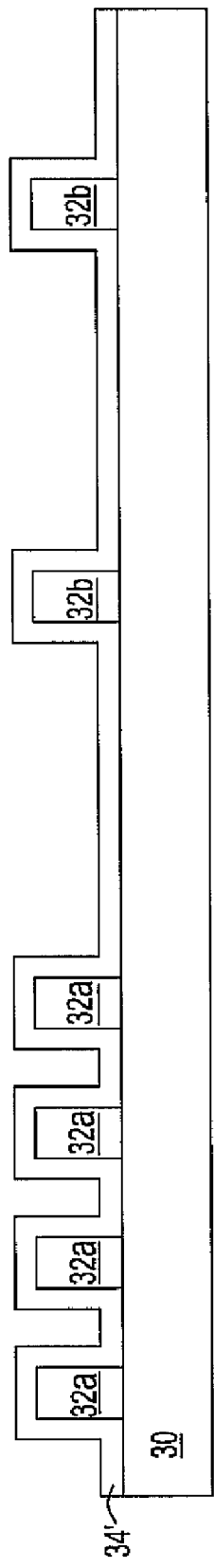

FIG. 4D shows the results of stripping the planarizing layer residues 38' from the microelectronic structure of FIG. 4C. The planarizing layer residues 38' may be stripped from the microelectronic structure of FIG. 4C to provide in-part the microelectronic structure of FIG. 4D while using methods and materials that are otherwise generally conventional in the microelectronic fabrication art. Included in particular, but also not limiting, are wet chemical stripping methods and dry plasma stripping methods.

Figure 4E:
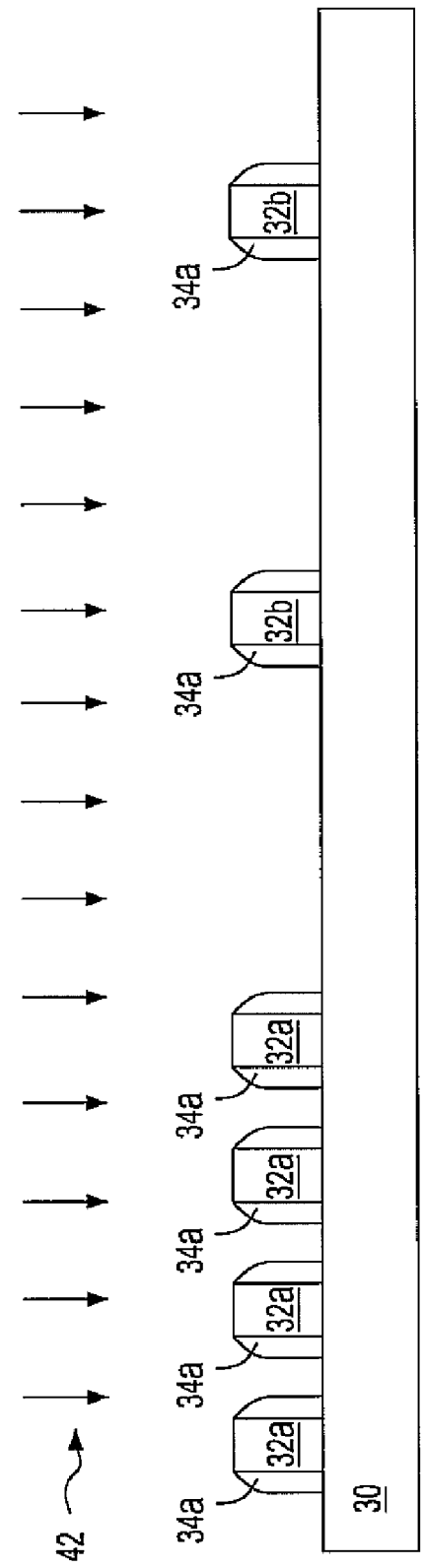

FIG. 4E shows a schematic cross-sectional diagram illustrating the results of further anisotropically etching the microelectronic structure of FIG. 4D while using the same anisotropic etchant 42 of FIG. 3C, to provide a microelectronic structure that includes closely spaced topographic features 32a and widely spaced topographic features 32b that have adjoining sidewalls thereof spacers 34a that have a uniform linewidth. The microelectronic structure of FIG. 4E thus corresponds with the microelectronic structure of FIG. 3C.

FIG. 5A to FIG. 5C show a series of schematic cross-sectional diagrams illustrating the results of progressive stages in fabricating a microelectronic structure in accordance with yet another embodiment of the invention. This other embodiment of the invention comprises a fourth embodiment of the invention.

FIG. 5A shows a schematic cross-sectional diagram of the microelectronic structure at an early stage in the fabrication thereof in accordance with this fourth embodiment.

FIG. 5A shows the same base microelectronic structure including the substrate 30, the closely spaced topographic features 32a and the widely spaced topographic features 32b that are illustrated within the schematic cross-sectional diagram of FIG. 3A, including, as well, the variable thickness spacer material layer 34. FIG. 5A also shows the same mask 36 that is illustrated in FIG. 3B located and formed covering the variable thickness spacer material layer 34 over the closely spaced topographic features 32a, but not the widely spaced topographic features 32b.

FIG. 5B shows the results of etching the variable thickness spacer material layer 34 while using the anisotropic etchant 42 that is illustrated in FIG. 3C to provide spacers 34a located adjacent and adjoining the widely spaced topographic features 32b and a partially etched spacer material layer 34'' covered by the mask 36.

FIG. 5C first shows the results of stripping the mask 36 to leave exposed the partially etched spacer material layer 34 located over the narrowly spaced topographic features 32b. Such stripping may be effected using methods and materials that are otherwise generally conventional in the microelectronic fabrication art. Included in particular, but also not limiting are wet chemical stripping methods and dry plasma stripping methods.

FIG. 5C also shows a mask 36' located and formed covering the widely spaced topographic features 32b including the spacers 34a. The mask 36' is generally analogous, equivalent or identical to the mask 36 that is illustrated in FIG. 5B, but provided in a different location covering the widely spaced topographic features 32b rather than the closely spaced topographic features 32a.

FIG. 5C finally shows the results of anisotropically etching the remaining partially etched spacer material layer 34'' that is illustrated within the schematic cross-sectional diagram of FIG. 5B to form spacers 34a located and formed adjacent and adjoining the narrowly spaced topographic features 32a. Upon stripping the mask 36' from the microelectronic structure of FIG. 5C, there is provided a microelectronic structure including narrowly spaced topographic features 32a and widely spaced topographic features 32b that have formed located adjacent and adjoining thereto spacers 34a of a single and uniform linewidth in accordance with the second embodiment and the third embodiment.

FIG. 6A to FIG. 6C show a series of schematic cross-sectional diagrams illustrating the results of progressive stages in fabricating a microelectronic structure in accordance with yet another embodiment of the invention. This other embodiment of the invention comprises a fifth embodiment of the invention.

FIG. 6A shows a schematic cross-sectional diagram of the microelectronic structure at an early stage in the fabrication thereof in accordance with this fifth embodiment.

In a first instance, FIG. 6A replicates the basic microelectronic structure of FIG. 3A, including the substrate 30, the narrowly topographic features 32a, the widely spaced topographic features 32b located and formed thereupon and the variable thickness spacer material layer 34 located and formed further thereupon.

FIG. 6B shows the results of an unmasked anisotropic etching of the microelectronic structure whose schematic cross-sectional diagram is illustrated in FIG. 6A while using the anisotropic etchant 42, to provide a spacer material layer 34'' located and formed upon the widely spaced topographic features 32b, as well as spacers 34a located and formed adjacent and adjoining the closely spaced topographic features 32a. Typically, the etching that is used to provide the microelectronic structure of FIG. 6B from the microelectronic structure of FIG. 6A is an anisotropic etching that is used for incompletely etching the spacer material layer 34 that is illustrated in FIG. 6A to provide the spacer material layer 34'' that is illustrated in FIG. 6B.

FIG. 6C first shows the mask 36 located and formed covering the closely spaced topographic features 32a and the spacers 34a located adjacent and adjoining thereto. FIG. 6C also shows the result of further anisotropically etching the partially etched spacer material layer 34'' that is illustrated within the schematic cross-sectional diagram of FIG. 6B, while using the anisotropic etchant 42, to provide spacers 34a located and formed adjacent and adjoining the widely spaced topographic features 32b.

Upon stripping the mask 36 from the microelectronic structure of FIG. 6C there is provided a microelectronic structure in accordance with a fifth embodiment of a method in accordance with the invention. Similarly with the second embodiment, the third embodiment and the fourth embodiment, the fifth embodiment provides a microelectronic structure includes a substrate having 30 having located and formed thereover a plurality of closely spaced topographic features 32a and a plurality of widely spaced topographic features 32b. Both the closely spaced topographic features 32a and the widely spaced topographic features 32b have located and formed adjacent and adjoining thereto spacers 34a of a single nominally uniform linewidth dimension (i.e., typically within 1 to 10 percent that is within the context of manufacturing limitations).

A final embodiment of the invention is understood as comprising a reverse process ordering of the fifth embodiment, and more particularly comprises an embodiment related to the second embodiment but with the sequential use of the anisotropic etchant 42, rather than the isotropic etchant 40 followed by the anisotropic etchant 40.

As is understood by a person skilled in the art, the embodiments are particularly useful when the substrate 20/30 comprises a semiconductor substrate and the topographic features 22a/b/c and 32a/b comprise gates within field effect devices. Spacer 24a/b/c and 34a typically also comprise dielectric materials such as but not limited to silicon oxide materials and silicon nitride materials. The isotropic etchant 40 may comprise a suitable wet chemical etchant or dry plasma etchant. The anisotropic etchant 42 typically comprises a dry plasma etchant.

The preferred embodiments are illustrative of the invention rather than limiting of the invention. Revisions and modifications may be made to materials, structures and dimensions for methods for fabricating a microelectronic structure in accordance with the preferred embodiments, while still providing a method for fabricating a microelectronic structure in accordance with the invention, further in accordance with the accompanying claims.

What is claimed is:

1. A method for fabricating a microelectronic structure comprising:
   forming upon a substrate that includes a plurality of evenly spaced topographic features a conformal spacer material layer;
   forming upon the conformal spacer material layer a conformal resist layer;

differentially exposing and developing the conformal resist layer over different topographic features to leave remaining a differential thickness resist residue layer upon the conformal spacer material layer over the different topographic features; and sequentially etching the differential thickness resist residue layer and the conformal spacer material layer to provide different width spacers in direct contact with sidewalls of the different topographic features.

2. The method of claim 1 wherein the conformal resist layer comprises a positive resist material.

3. The method of claim 1 wherein the conformal resist layer comprises a negative resist material.

4. The method of claim 1 wherein the differentially exposing and developing uses a grey scale mask.

5. The method of claim 1 wherein the differentially exposing and developing uses separate binary masks.

6. The method of claim 1 wherein the substrate comprises a semiconductor substrate.

7. The method of claim 6 wherein the topographic features comprise gates within field effect devices.

8. The method of claim 7 wherein the conformal spacer material layer comprises a dielectric material.

9. A method for fabricating a microelectronic structure comprising:
    masking a lesser thickness portion of a spacer material layer that is in direct contact with a plurality of narrowly spaced topographic features within a structure that includes:
        the plurality of narrowly spaced topographic features and a plurality of widely spaced topographic features formed over a substrate; and
        the spacer material layer formed over the substrate and in direct contact with the closely spaced topographic features and in direct contact with the widely spaced topographic features, the spacer material layer having the lesser thickness portion over the narrowly spaced topographic features and a greater thickness portion over the widely spaced topographic features;
    isotropically etching the greater thickness portion of the spacer material layer to provide a partially etched spacer material layer;
    unmasking the lesser thickness portion of the partially etched spacer material layer; and
    anisotropically etching the partially etched spacer material layer to provide a plurality of uniform linewidth spacers in direct contact with the narrowly spaced topographic features and in direct contact with the widely spaced topographic features.

10. The method of claim 9 wherein the masking is a complete masking.

11. The method of claim 9 wherein the masking is an incomplete masking.

12. The method of claim 9 wherein the substrate comprises a semiconductor substrate.

13. The method of claim 12 wherein the narrowly spaced topographic features and the widely spaced topographic features comprise gates within field effect devices.

14. A method for fabricating a microelectronic structure comprising:
    anisotropically etching, while using a two-step anisotropic etch method that includes at least one masking step, a spacer material layer within a structure that includes:
        a plurality of narrowly spaced topographic features and a plurality of widely spaced topographic features formed over a substrate; and
        the spacer material layer formed over the substrate, the narrowly spaced topographic features and the widely spaced topographic features, the spacer material layer having the lesser thickness portion over the narrowly spaced topographic features and a greater thickness portion over the widely spaced topographic features;
the anisotropically etching using the two step anisotropic etch method includes a first anisotropic etch that provides uniform linewidth spacers adjoining the narrowly spaced topographic features while masking the widely spaced topographic features, and a second anisotropic etch that separately provides uniform linewidth spacers adjoining the widely spaced topographic features while masking the narrowly spaced topographic features.

15. The method of claim 14 wherein the first anisotropic etch is undertaken prior to the second anisotropic etch.

16. The method of claim 14 wherein the first anisotropic etch is undertaken after the second anisotropic etch.

17. The method of claim 14 wherein the two-step anisotropic etch method includes:
    a first anisotropic etch that provides the uniform linewidth spacers adjoining the narrowly spaced topographic features and a partially etched spacer material layer over the widely spaced topographic features, absent masking;
    a second anisotropic etch method that provides the uniform linewidth spacers adjoining the widely spaced topographic features while masking the narrowly spaced topographic features and the uniform linewidth spacers adjoining the narrowly spaced topographic features.

18. The method of claim 17 wherein the narrowly spaced topographic features and the widely spaced topographic features comprise gates within field effect transistors.

* * * * *